United States Patent [19]
Dimitrakopoulos et al.

[11] Patent Number: 5,981,970
[45] Date of Patent: Nov. 9, 1999

[54] THIN-FILM FIELD-EFFECT TRANSISTOR WITH ORGANIC SEMICONDUCTOR REQUIRING LOW OPERATING VOLTAGES

[75] Inventors: Christos Dimitrios Dimitrakopoulos, West Harrison; Peter Richard Duncombe, Peekskill; Bruce K. Furman, Beacon; Robert B. Laibowitz, Peekskill, all of N.Y.; Deborah Ann Neumayer, Danbury, Conn.; Sampath Purushothaman, Yorktown Heights, N.Y.

[73] Assignee: International Business Machines Corporation, Armonk, N.Y.

[21] Appl. No.: 08/827,018

[22] Filed: Mar. 25, 1997

[51] Int. Cl.$^6$ .................................................. H01L 35/24
[52] U.S. Cl. .............................. 257/40; 257/295; 257/410
[58] Field of Search ............................ 257/40, 295, 410, 257/310; 438/99, 1

[56] References Cited

U.S. PATENT DOCUMENTS

| | | | |
|---|---|---|---|
| 4,724,106 | 2/1988 | Morimoto et al. | 264/24 |
| 5,075,738 | 12/1991 | Matsuda et al. | 357/6 |
| 5,206,525 | 4/1993 | Yamamoto et al. | 257/40 |
| 5,347,144 | 9/1994 | Garnier et al. | 257/40 |
| 5,625,199 | 4/1997 | Baumbach et al. | 257/40 |
| 5,705,826 | 1/1998 | Aratani et al. | 257/40 |

OTHER PUBLICATIONS

"Molecular Beam Deposited Thin Films of Pentacene for Organic Field Effect Transistor Applications", C.D. Dimitrakopoulos et al., J. Appl. Phys. 80(4), Aug. 1996, pp. 2501–2508.

"A Field–Effect Transistor Based on Conjugated Alpha–Sexithienyl", G. Horowitz et al., Solid State Comm., vol. 72, No. 4, 1989, pp. 381–384.

"All–Polymer Field–Effect Transistor Realized by Printing Techniques", F. Garnier et al., Science, vol. 265, Sep. 1994, pp. 1684–1686.

"All–organic field–effect transistors made of π–conjugated oligomers and polymeric insulators", G. Horowitz et al., Synthetic Metals, 54 (1993) pp. 435–445.

"Dielectrics for Field Effect Technology", Pieter Balk, Adv. Mater. 1995, 7, No. 8, pp. 703–710.

"Precursor route pentacene metal–insulator–semiconductor field–effect transistors", A.R. Brown et al., J. Appl. Phys. 79(4), Feb. 1996, pp. 2136–2138.

*Primary Examiner*—Sara Crane
*Attorney, Agent, or Firm*—Daniel P. Morris

[57] ABSTRACT

A thin film transistor (TFT) device structure based on an organic semiconductor material, that exhibits a high field effect mobility, high current modulation and a low sub-threshold slope at lower operating voltages than the current state of the art organic TFT devices. The structure comprises a suitable substrate disposed with he following sequence of features: a set of conducting gate electrodes covered with a high dielectric constant insulator, a layer of the organic semiconductor, sets of electrically conducting source and drain electrodes corresponding to each of the gate lines, and an optional passivation layer that can overcoat and protect the device structure.

Use of high dielectric constant gate insulators exploits the unexpected gate voltage dependence of the organic semi-conductor to achieve high field effect mobility levels at very low operating voltages. Judicious combinations of the choice of this insulator material and the means to integrate it into the TFT structure are taught that would enable easy fabrication on glass or plastic substrates and the use of such devices in flat panel display applications.

20 Claims, 9 Drawing Sheets

THIN-FILM FIELD-EFFECT TRANSISTOR WITH ORGANIC SEMICONDUCTOR REQUIRING LOW OPERATING VOLTAGES

CROSS REFERENCE TO RELATED APPLICATION

U.S. application Ser. No. 08/827,015 entitled, "FABRICATION OF THIN FILM FIELD EFFECT TRANSISTOR COMPRISING AN ORGANIC SEMICONDUCTOR AND CHEMICAL SOLUTION DEPOSITED METAL OXIDE GATE DIELECTRIC" to C. D. Dimitrakopoulos et al. filed on the same day herewith is incorporated herein by reference.

FIELD OF THE INVENTION

This invention pertains to the field of organic thin film field effect transistors (TFT), in particular to flat panel liquid crystal displays using such transistors.

BACKGROUND AND PRIOR ART

Thin film field effect transistors (TFT) used in liquid crystal display (LCD) applications typically use amorphous silicon (a-Si:H) as the semiconductor and silicon oxide and/or silicon nitride as the gate insulator. Recent developments in materials have led to the exploration of organic oligomers such as hexathiophene and derivatives, and organic molecules such as pentacene (G. Horowitz, D. Fichou, X. Peng, Z. Xu, F. Garnier, *Solid State Commun.* Volume 72, pg. 381, 1989; F. Garnier, G. Horowitz, D. Fichou, U.S. Pat. No. 5,347,144) as potential replacements for amorphous silicon as the semiconductor in thin-film field-effect transistors.

The highest field effect mobility in thiophene-oligomer-based TFT's is usually about 0.06 cm$^2$ V$^{-1}$ sec$^{-1}$ (F. Garnier, R. Hajlaoui, A. Yassar, P. Srivastava, *Science*, Volume 265, pg. 1684, 1994), which is substantially lower than the mobility of standard a-Si:H TFT's. Only in the case that the organic insulator cyanoethylpullulane was used, was a higher field effect mobility measured (0.4 cm$^2$ V$^{-1}$ sec$^{-1}$, F. Garnier, G. Horowitz, D. Fichou, U.S. Pat. No. 5,347,144). However, that insulator exhibits some undesirable characteristics such as inferior dielectric strength, mobile charges, (G. Horowitz, F. Deloffre, F. Garnier, R. Hajlaoui, M. Hmyene, A. Yassar, *Synthetic Metals*, Volume 54, pg 435, 1993) and sensitivity to humidity. Hence it is not suitable for use as a gate insulator in the fabrication of practical TFT devices.

Field effect mobility up to 0.6 cm$^2$ V$^{-1}$ sec$^{-1}$ has recently been achieved in pentacene based TFT's with SiO$_2$ as the gate insulator (Y. Y. Lin, D. J. Gundlach, T. N. Jackson, 54$^{th}$ *Annual Device Research Conference Digest*, 1996 pg. 80), making them potential candidates for such applications. Major drawbacks of these pentacene-based organic TFT's are high threshold voltage, high operating voltages required to achieve high mobility and simultaneously produce high current modulation (typically about 100 V when 0.4 μm thick SiO$_2$ insulator is used), and high sub-threshold slope, S, which is approximately 14 V per decade of current modulation (Y. Y. Lin, D. J. Gundlach, T. N. Jackson, 54$^{th}$ *Annual Device Research Conference Digest*, 1996, pg. 80) as compared to about 0.3 V per decade of current modulation achieved in a-Si:H based TFT's (C.-Y. Chen, J. Kanicki, 54$^{th}$ *Annual Device Research Conference Digest*, 1996, pg. 68). Reducing the thickness of the gate insulator would improve the above mentioned characteristics but there is a limit to the decrease of the insulator thickness, which is imposed by ease of manufacturing and reliability issues. For example in the current generation of TFT LCD devices the thickness of the TFT gate insulator is typically 0.4 μm.

The electrical characteristics of TFT's having pentacene as the semiconductor, a heavily doped Si-wafer as the gate electrode, thermally grown SiO$_2$ on the surface of the Si-wafer as the gate insulator, and Au source and drain electrodes, are adequately modeled by standard field effect transistor equations (S. M. Sze "*Physics of Semiconductor Devices*", Wiley, New York, 1981, pg. 442), as shown previously (G. Horowitz, D. Fichou, X. Peng, Z. Xu, F. Garnier, *Solid State Commun.* Volume 72, pg. 381, 1989; C. D. Dimitrakopoulos, A. R. Brown, A. Pomp, *J Appl. Phys.* Volume 80, pg. 2501, 1996). The pentacene used in these devices behaves as a p-type semiconductor. FIG. 1, cited from Y. Y. Lin, D. J. Gundlach, T. N. Jackson, 54$^{th}$ *Annual Device Research Conference Digest*, 1996pg. 80, shows the dependence of the current flowing between the source and drain electrodes (I$_D$) on the voltage applied to the drain electrode (V$_D$), at discrete voltages applied to the gate electrode (V$_G$). When the gate electrode is biased negatively with respect to the grounded source electrode, pentacene-based TFT's operate in the accumulation mode and the accumulated carriers are holes. At low V$_D$, I$_D$ increases linearly with V$_D$ (linear region) and is approximately given by the equation:

$$I_D = \frac{WC_i}{L}\mu\left(V_G - V_T - \frac{V_D}{2}\right)V_D \qquad (1)$$

where L is the channel length, W is the channel width, C$_i$ is the capacitance per unit area of the insulating layer, V$_T$ is a threshold voltage, and μ is the field effect mobility. μ can be calculated in the linear region from the transconductance:

$$g_m = \left(\frac{\partial I_D}{\partial V_G}\right)_{V_D=const} = \frac{WC_i}{L}\mu V_D, \qquad (2)$$

by plotting I$_D$ vs. V$_G$ at a constant low V$_D$ and equating the value of the slope of this plot to g$_m$.

When the drain electrode is more negatively biased than the gate electrode (i.e. $-V_D \geq -V_G$), with the source electrode being grounded (i.e. V$_s$=0), the current flowing between source and drain electrodes (I$_D$) tends to saturate (does not increase any further) due to the pinch-off in the accumulation layer (saturation region), and is modeled by the equation:

$$I_D = \frac{WC_i}{2L}\mu(V_G - V_T)^2. \qquad (3)$$

FIG. 2a shows the dependence of I$_D$ on V$_G$ in saturation (Y. Y. Lin, D. J. Gundlach, T. N. Jackson, 54$^{th}$ *Annual Device Research Conference Digest*, 1996, pg. 80). The field effect mobility can be calculated from the slope of the $\sqrt{|I_D|}$ vs. V$_G$ plot. FIG. 2b shows a plot of the square root of I$_D$ vs V$_G$. A mobility of 0.62 cm$^2$ V$^{-1}$ sec$^{-1}$ can be calculated from this plot. The sub-threshold slope, S, is approximately 14 volts per decade of current modulation (Y. Y. Lin, D. J. Gundlach, T. N. Jackson, 54$^{th}$ *Annual Device Research Conference Digest*, 1996, pg. 80).

OBJECT OF THE INVENTION

It is an object of this invention is to demonstrate TFT structures that overcome the need to use high operating voltages in order to achieve the desirable combination of high field effect mobility, low threshold voltage, low sub-threshold slope, and high current modulation, without having to reduce the thickness of the insulator. Such structures contain an inorganic high dielectric constant gate insulator layer (for example, barium strontium titanate) in combination with an organic semiconductor (for example, pentacene).

It is another object of this invention to produce organic TFT structures wherein the high dielectric constant gate insulator is deposited and processed at temperatures compatible with glass and plastic substrates (150 to 400° C.), which are substantially lower than the processing temperatures of these materials when they are used for memory applications (up to 650° C.).

SUMMARY OF THE INVENTION

The proposed TFT structures make use of a high dielectric constant thin film gate insulator, an organic semiconductor such as pentacene, and a metal, conducting polymer, highly doped high conductivity material or a combination thereof as the gate, source, and drain electrodes.

There are many candidate materials with high dielectric constant that can be used as gate insulator layers in the above structures, including but not restricted to $Ta_2O_5$, $Y_2O_3$, $TiO_2$, and the family of ferroelectric insulators, including but not restricted to $PbZr_xTi_{1-x}O_3$ (PZT), $Bi_4Ti_3O_{12}$, $BaMgF_4$, barium zirconate titanate (BZT) and $Ba_xSr_{1-x}TiO_3$ (BST). These materials have been studied and used in the past in combination with inorganic semiconductors mainly for memory device applications (P. Balk, *Advanced Materials*, Volume 7, pg. 703, 1995 and references therein) but never in combination with organic semiconductors. Typically these insulators are annealed at 600° C. or higher to achieve dielectric constant ($\epsilon$) values exceeding 150.

In general the proposed structure uses an inorganic, high dielectric constant gate insulator in combination with an organic semiconductor (e.g. pentacene) in a TFT structure. The high $\epsilon$ insulator is annealed at 400° C. to achieve an $\epsilon \geq 15$, which makes possible the use of glass or plastic substrates. If a high dielectric constant organic insulator was available ($\epsilon \geq 15$) which also fulfilled other requirements, such as environmental stability, high breakdown voltage, good film-forming capability, absence of mobile charges, it could also be used instead of the previously mentioned inorganic insulators for the proposed structures.

A typical sequence used in the fabrication of the proposed TFT structures includes the following steps:

preparation of the gate electrode, which can be either the substrate itself, in such case being heavily doped Si, or a patterned metal (or conducting polymer or other conductive material) gate electrode deposited and patterned on a substrate;

deposition of the high dielectric constant gate insulator on top of the gate electrode by one of various processes including but not restricted to sol gel spin coating and baking, sputtering, chemical vapor deposition (CVD), laser ablative deposition, and physical vapor deposition;

optionally annealing the films at a suitable temperature in the range of 150 to 400° C. to improve the film quality and enhance the dielectric constant;

deposition of the organic semiconductor on top of the gate insulator by one of various processes including but not restricted to vapor deposition, spin-coating from solution or self assembly of layers from solution;

fabrication of the electrically conducting source and drain electrodes on top of the organic semiconductor;

and optionally applying a passivation coating of an insulator by chemical vapor deposition (CVD), physical vapor deposition or spin coating and curing.

The sequence of the steps comprising the deposition of the organic semiconductor and the fabrication of the source and drain electrodes could be reversed to allow process compatibility and ease of fabrication.

DETAILED DESCRIPTION OF THE PREFERRED EMBODIMENTS

Figure 1:
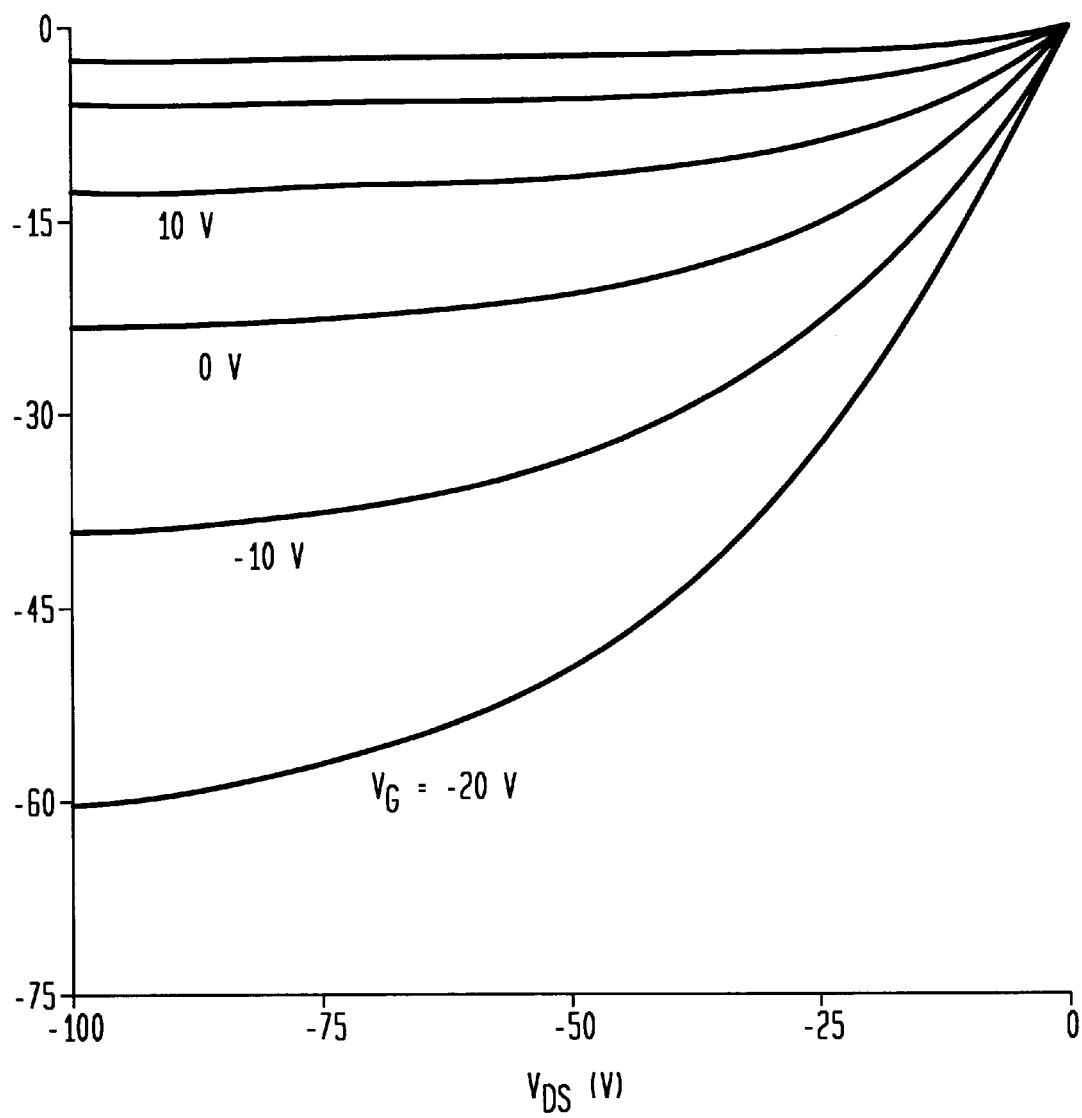
FIG. 1 depicts the operating characteristics of a pentacene-based TFT device with $SiO_2$ gate insulator. Dependence of drain current as a function of source-drain voltage is shown for different discrete values of the gate voltage. Cited from Lin et al., 1996.
Figure 2A:
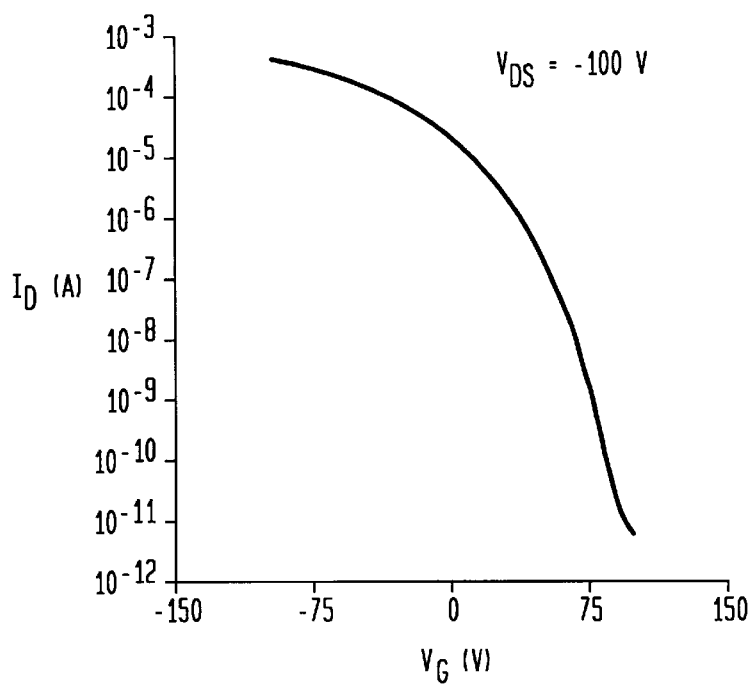
FIG. 2a shows the same data as in FIG. 1 replotted to show the dependence of the drain current as a function of the gate voltage in the saturation regime.
Figure 2B:
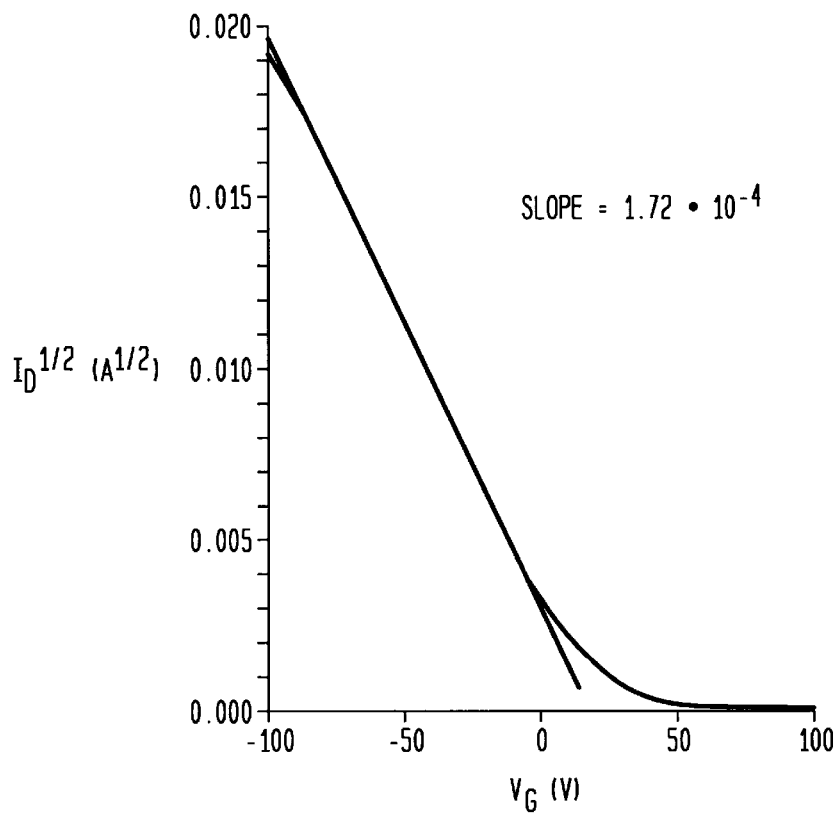
FIG. 2b is a plot of the square root of the drain current from FIG. 21a as a function of the gate voltage in the saturation regime to calculate the field effect mobility.
Figure 3:
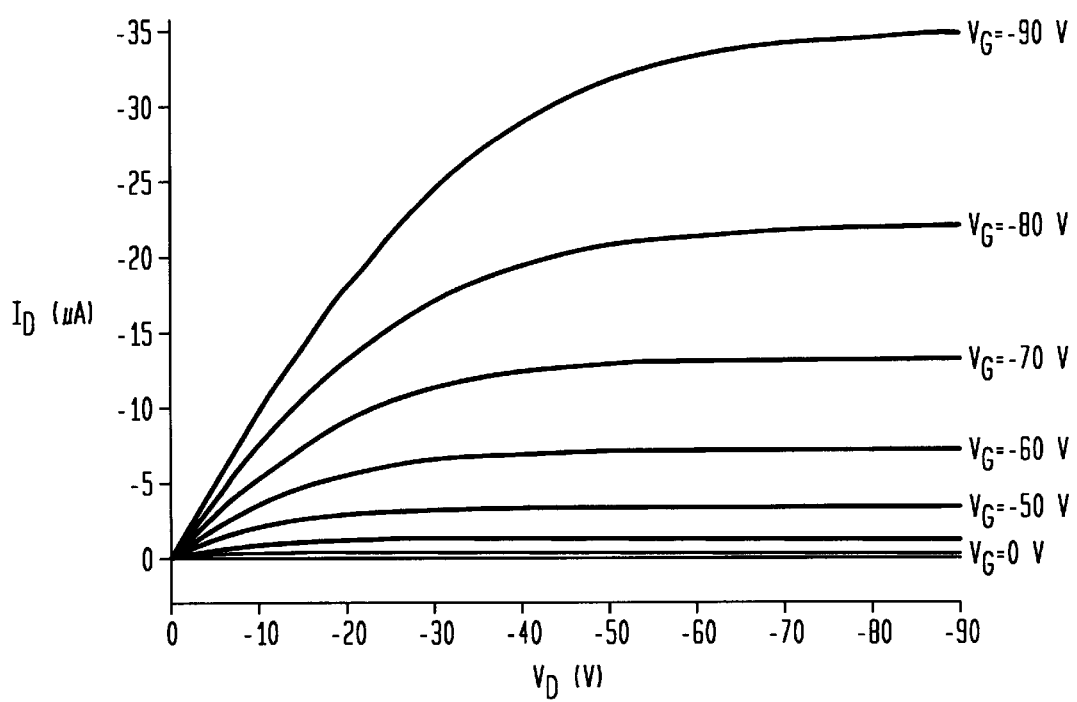
FIG. 3 is the measured operating characteristics of a TFT device using as-received (97+% pure) pentacene as semiconductor and an 120 nm thick $SiO_2$ as gate insulator.

FIG. 3, which corresponds to a device having as-received pentacene (97+% purity, purchased from FLUKA Chemical Co.) as semiconducting layer, a heavily doped Si wafer as gate electrode, 120 nm thick thermally grown $SiO_2$ as gate insulator, and Au source and drain electrodes, shows the dependence of the current flowing between source and drain electrodes ($I_D$) on the voltage applied to the drain electrode ($V_D$), at discrete voltages applied to the gate electrode ($V_G$). The linear region of the plots (i.e. at low $V_D$) can be modeled by Equation 1 as discussed previously.

Figure 4A:
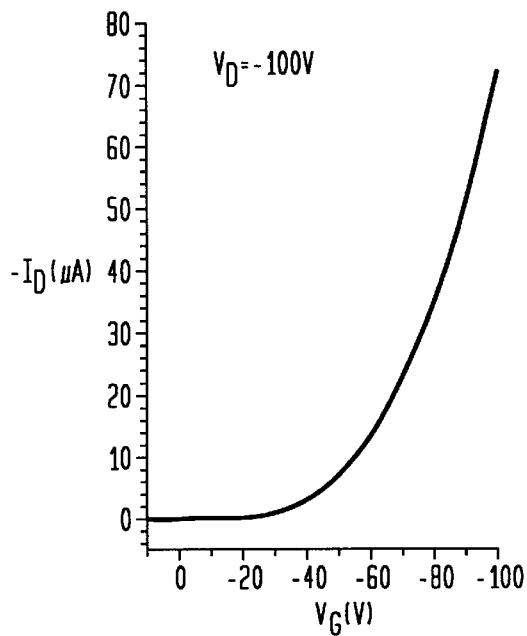
FIG. 4a is a replot of the data from FIG. 3 showing the dependence of the drain current on gate voltage in the saturation regime.
Figure 4B:
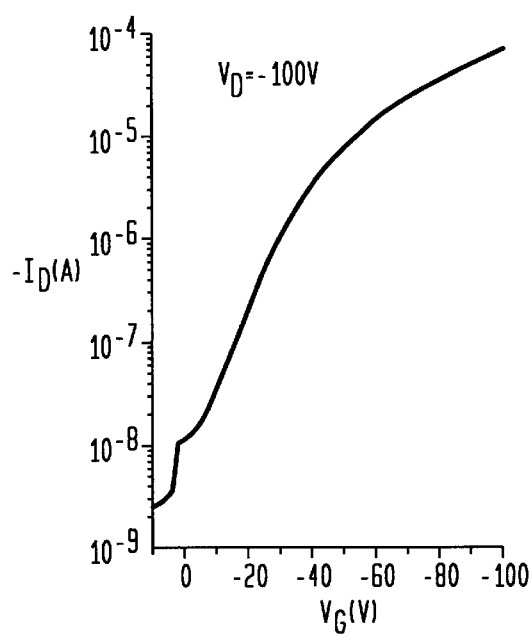
FIG. 4b depicts the data from FIG. 4a in a semilogarithmic scale used to calculate the current modulation and sub-threshold slope.
Figure 4C:
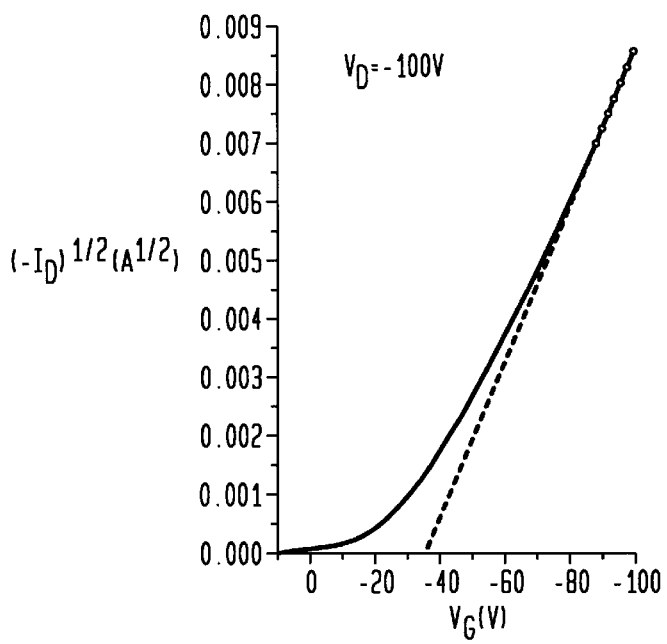
FIG. 4C is a plot of the square root of the drain current from FIG. 4a as a function of the gate voltage in the saturation regime to calculate the field effect mobility.
Figure 5:
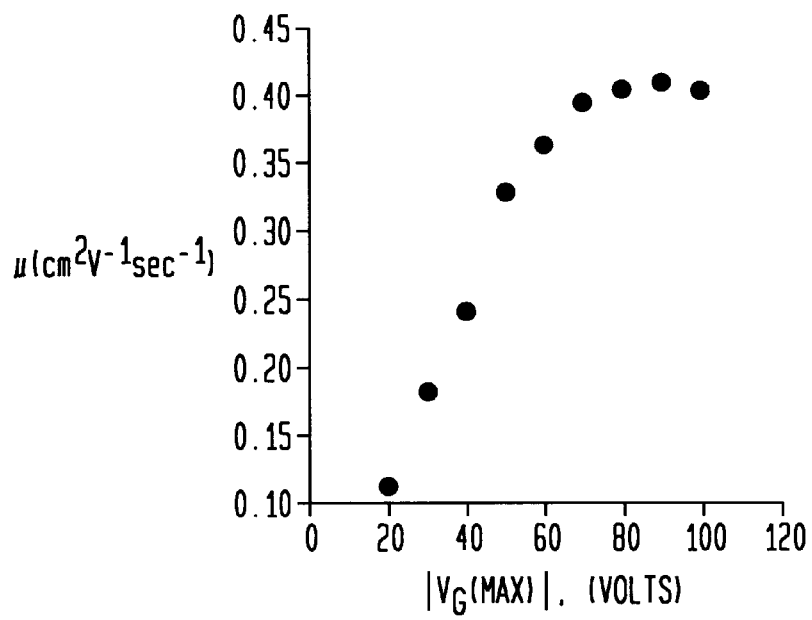
FIG. 5 is a plot of the field effect mobility calculated for the devices characterized by FIG. 3 at different gate voltages but at the same source-drain voltage (-100 V), showing that there is a strong dependence of the mobility on gate voltage.

FIG. 4a and 4b correspond to the same device as above and show the dependence of $I_D$ on $V_G$ in the saturation region. The field effect mobility, $\mu$, was calculated from the slope of the $\sqrt{|I_D|}$ vs. $V_G$ plot (FIG. 4c) to be 0.52 cm$^2$ V$^{-1}$ sec$^{-1}$. The sub-threshold slope, S, is 13.7 volts per decade of current modulation. These data are comparable to the ones for similar TFT structures described earlier as part of the prior art review. As explained earlier, although the mobility is acceptable for practical TFT applications, the operating voltage and the sub-threshold slope are far too high compared to a-Si:H TFT's. The field effect mobility measured from TFT devices such as the one corresponding to FIG. 3 and FIG. 4, shows a gate voltage dependence. In particular, high mobilities are obtained at higher gate voltages. This in turn results in the need for using impractically high operating voltages in these devices to obtain acceptable mobilities. To solve this problem we have examined the dependence of the field effect mobility, $\mu$, measured from TFT devices such as the one corresponding to FIG. 3 and FIG. 4, on the applied gate voltage, $V_G$ in greater detail. FIG. 5 shows the dependence of $\mu$ on the maximum $V_G$ used at different gate-voltage-sweep experiments while $V_D$ was kept constant at −100 V and $V_s$ was always set to 0 volts.

The observed behavior is attributable to a dependence of mobility on the gate field, E, where E=dv/dy and y is the thickness of the insulator, in which case the high gate fields can be achieved by using a thinner gate dielectric layer. This is typically the methodology used in the prior art for inorganic semiconductor TFT devices but suffers from the limitation that thin dielectrics are prone to pinhole defects and exhibit lower dielectric breakdown voltages and higher leakage currents. Hence this approach is not a fruitful one to harness the gate voltage dependent mobility of pentacene based TFT's.

Alternatively it is possible, although not expected, that the gate voltage dependence is a manifestation of the changes in the accumulated carrier concentration at the semiconductor/insulator interface. It is probable, that in organic semiconductors the extra accumulation of charge carriers facilitates the filling of trap states thereby allowing the additional carriers to move more easily without being hampered by the trapping process. We propose to facilitate charge accumulation by replacing $SiO_2$ with an insulator that has a similar thickness but a much higher dielectric constant, In this case, a similar accumulated carrier concentration is attained as in the $SiO_2$ case, but at much lower gate fields and thus gate voltages, with all the other parameters kept the same.

If this hypothesis is correct, a high mobility should be achieved in these devices at lower voltages compared to TFT's using comparable thickness of $SiO_2$. In the opposite case, in other words if the mobility was field dependent but independent of the carrier concentration, a relatively low mobility should be observed at the low gate voltages used in the case of the latter sample. As will be shown in the following, comparing the measured field effect mobilities from devices based on the two different insulators with comparable thickness but different dielectric constants, supports our hypothesis. The following example details the fabrication of a pentacene based TFT using a high dielectric constant inorganic film as the gate insulator and the resulting high field effect mobilities at low operating voltages.

EXAMPLE 1

We have fabricated TFT's having as gate insulator a thin film of barium strontium titanate (BST), which was deposited using sol gel techniques. The organic semiconductor used in these devices was pentacene deposited by vacuum sublimation. The gate electrode was aluminum or a Pt/Ti bilayer while the source and drain electrodes consisted of Au. The substrates used were either quartz disks or Si wafers covered with a thermally grown $SiO_2$ layer.

Oxidized silicon or quartz substrates were cleaned in an isopropanol bath using ultrasonic agitation and dried with nitrogen. They were then assembled with a metal mask with openings corresponding to the gate lines and placed and pumped down to high vacuum in an electron beam evaporator. Gate metallization of either 40 nm of aluminum or a bilayer of 15 nm titanium followed by 30 nm of Pt was deposited on the substrates by electron beam evaporation. The samples were unloaded from the assembly and coated with a layer of high dielectric constant insulator by the sol gel process.

In this process metal oxide films are fabricated using a precursor comprising either a short chain metal alkoxide exemplified by but not restricted to metal isopropoxide, or a second type of organometallic precursor solution. The solution is applied by liquid deposition (for example spin coating) onto a substrate. The coated substrate is baked to dry the precursor, and then annealed. Specifically, the spin solution was loaded into a syringe with 0.45 $\mu$m and 0.2 $\mu$m Whatman syringe filters attached on it. The solution was syringed onto the substrate until the substrate was completely wetted. The substrate was then spun for 45 sec at 2500 rpm. The coated substrate was dried on a hot plate at 200–400° C. and then annealed at temperatures up to 400° C. for 10–20 min. The process can be repeated to fabricate thicker films by successive coating and annealing steps.

The films were baked intentionally at only moderate temperatures (up to 400° C.) in order to be compatible with glass and plastic substrates. This results in an amorphous insulator film which has a dielectric constant of about 16 as compared to values close to 300 or more achieved when the films are heat treated at 650° C. leading to crystallization. As will be seen shortly, the modest increase in dielectric constant obtained by using these amorphous films is adequate for the purpose of the organic TFT application. However, the scope of the present invention is not limited to such deposition process only. BST films and films of most of the previously mentioned high dielectric constant gate insulators can be alternately deposited using sputter deposition techniques, laser ablation, or CVD deposition and these methods could be used without deviating from the spirit of our invention.

The organic semiconductor layer (pentacene) was deposited using vapor deposition in an ultra high vacuum (UHV) chamber. We have also used deposition in lower cost high vacuum chambers and comparable results are also obtained in this case. Alternatively, this film could be deposited using a soluble precursor of pentacene which is converted to pentacene by heating up to 140° C. in vacuo (A. R. Brown, A. Pomp, D. M. de Leeuw, D. B. M. Klaassen, E. E. Havinga, P. Herwig, K. Müallen *Journal of Applied Physics*, Volume 79, pg. 2136, 1996). The samples are then assembled with a mask provided with openings for source and drain contact electrodes, placed and pumped down in an electron beam evaporator and coated with 60 nm of gold to produce the source/drain contacts. The resulting TFT structure is shown schematically in FIG. 6. Other source drain contact materials such as chromium, titanium, copper, aluminum, molybdenum, tungsten, nickel, gold, platinum, palladium, conducting polymers, oligomers and organic molecules, can be used without deviating from the spirit of the invention.

Completed TFT samples were then tested electrically using a Hewlett Packard Model 4145B semiconductor parameter analyzer to determine their operating characteristics.

Figure 6:
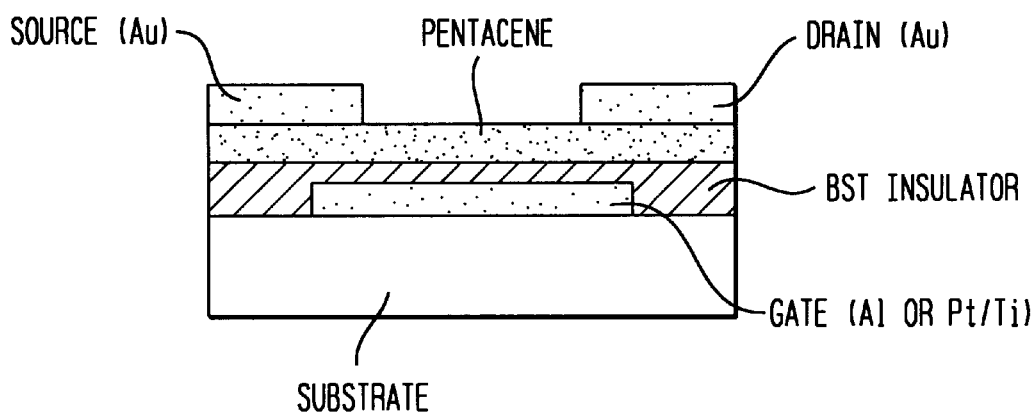
FIG. 6 is a schematic sketch of the pentacene-based TFT devices with a high dielectric constant gate insulator proposed in this application.
Figure 7A:
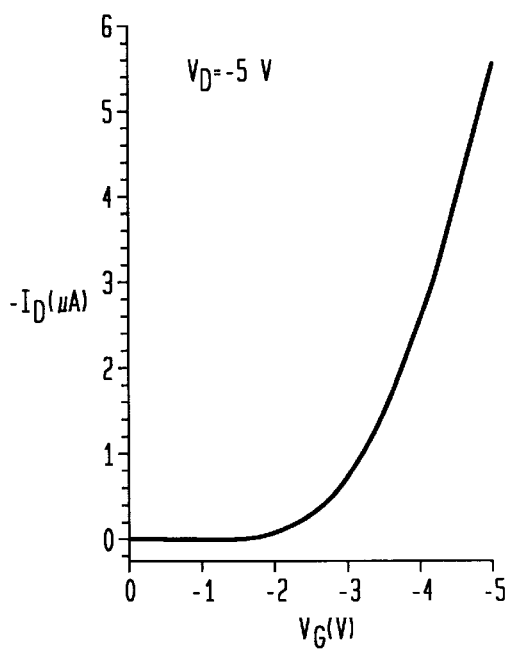
FIG. 7a is the measured operating characteristics of a TFT device using as-received (97+% pure) pentacene as semiconductor and a 90 nm thick layer of barium strontium titanate film (deposited by sol gel processing from an isopropoxide based precursor solution) as the gate insulator. Dependence of the drain current on the gate voltage at a fixed source-drain voltage is shown.
Figure 7B:
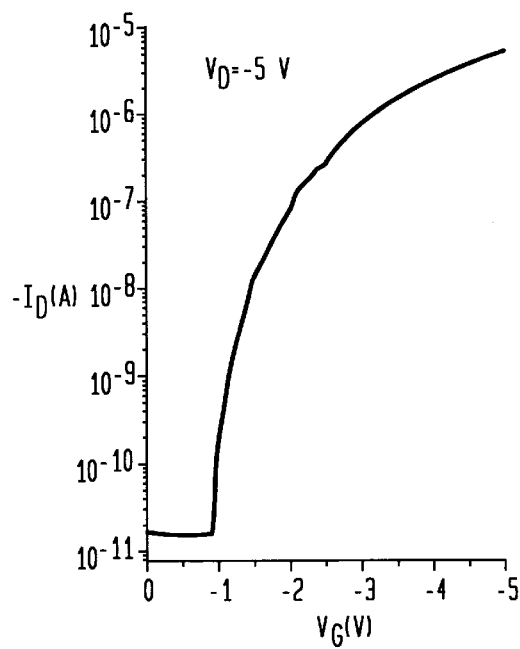
FIG. 7b is the plot of the data from FIG. 7a in a semilogarithmic scale used to calculate the current modulation and sub-threshold slope.
Figure 7C:
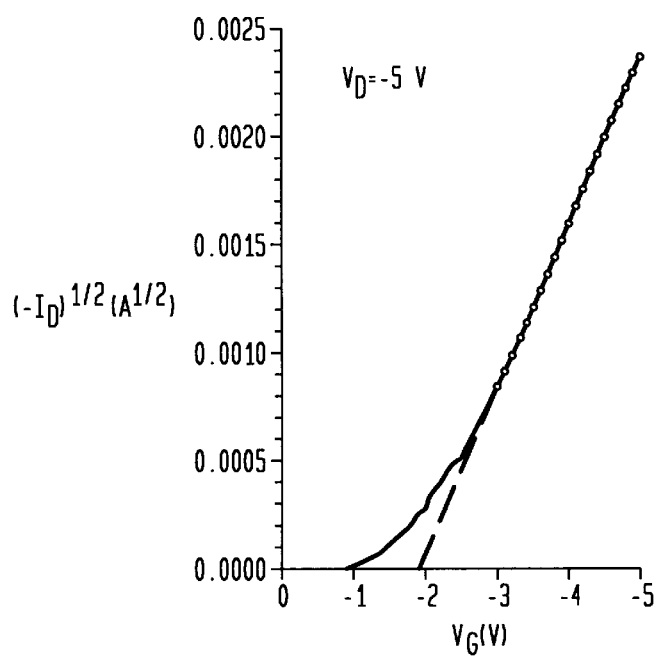
FIG. 7c is a plot of the square root of the drain current from FIG. 7a as a function of the gate voltage in the saturation regime to calculate the field effect mobility.

FIG. 7a and 7b are typical examples of a pentacene-based TFT, represented by the schematic drawing in FIG. 6, in which the thickness of the BST gate-insulator was approximately 90 nm and its dielectric constant, $\epsilon=16$. The insulator was deposited from an isopropoxide based solution in isopropanol as described earlier. The source drain separation (channel length, L) was 83 $\mu$m and the channel width, W, was 1500 $\mu$m. Both figures show the dependence of $I_D$ on $V_G$ in saturation. FIG. 7c shows a plot of the square root of $I_D$ vs $V_G$. The field effect mobility, $\mu$, is calculated from the slope of the $\sqrt{|I_D|}$ vs. $V_G$ plot to be 0.38 cm$^2$ V$^{-1}$ sec$^{-1}$. The current modulation is more than $3\times10^5$ for a gate voltage variation of 4 volts. The sub-threshold slope, S, is approximately 0.4 volts per decade of current modulation.

Figure 8:
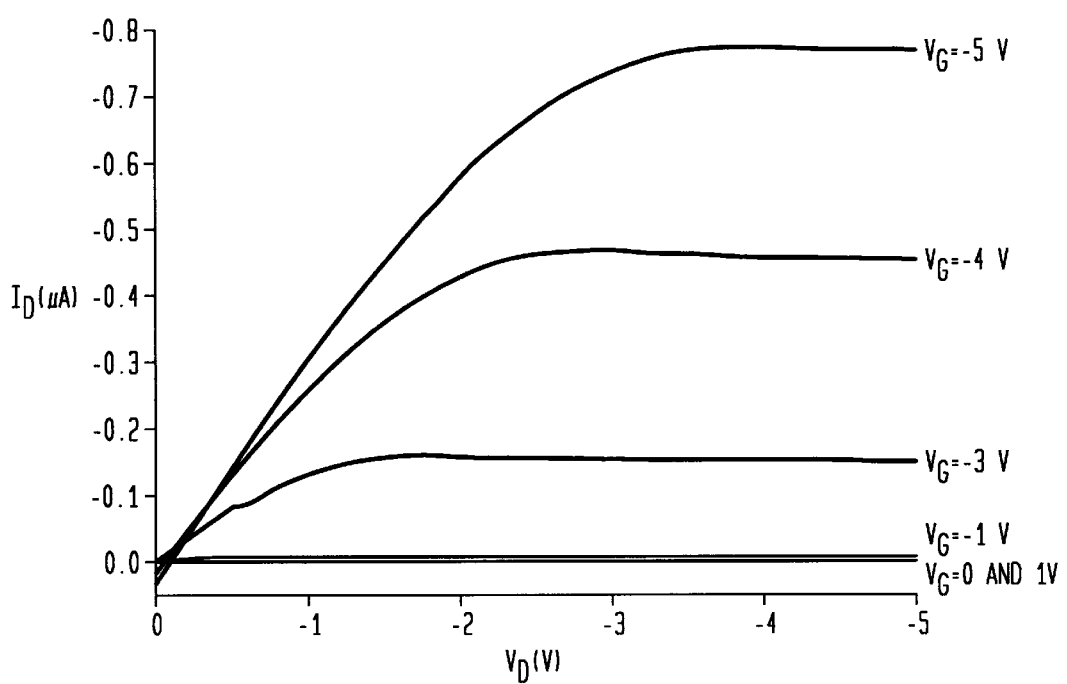
FIG. 8 is the measured operating characteristics of a TFT device using as-received (97+% pure) pentacene as semiconductor and a barium strontium titanate film (deposited by sol gel processing from an alkoxide based precursor solution) as the gate insulator. Dependence of the drain current on the source-drain voltage is shown at different gate voltage levels.
Figure 8A:
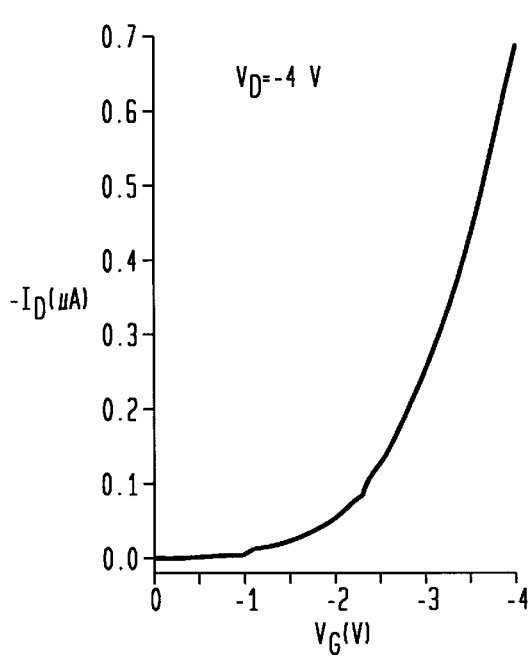
Figure 8B:
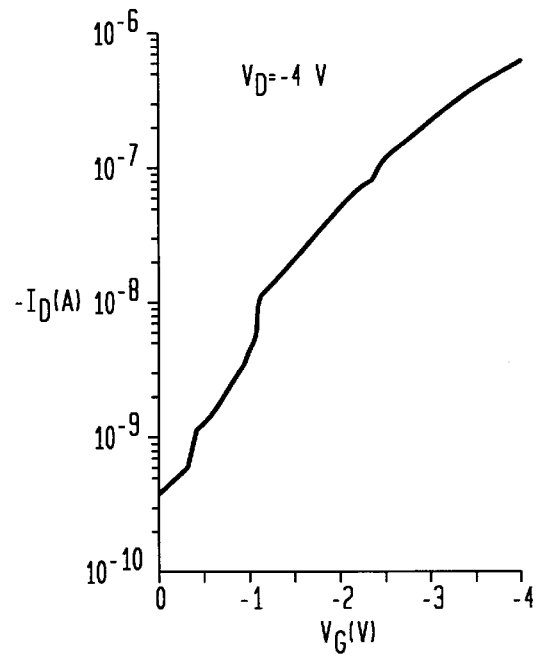
Figure 8C:
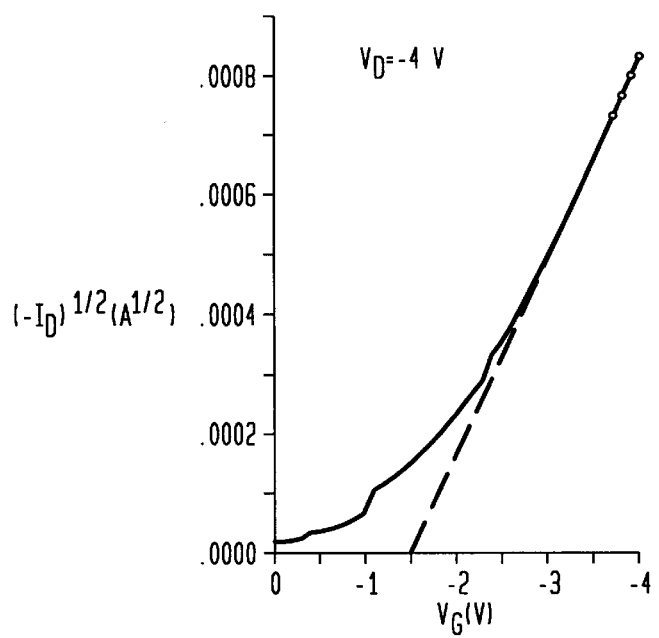

FIG. 8 shows the dependence of the current flowing between source and drain electrodes ($I_D$) on the voltage applied to the drain electrode ($V_D$), at discrete voltages applied to the gate electrode ($V_G$) for the device described in the previous paragraph.

Figure 9A:
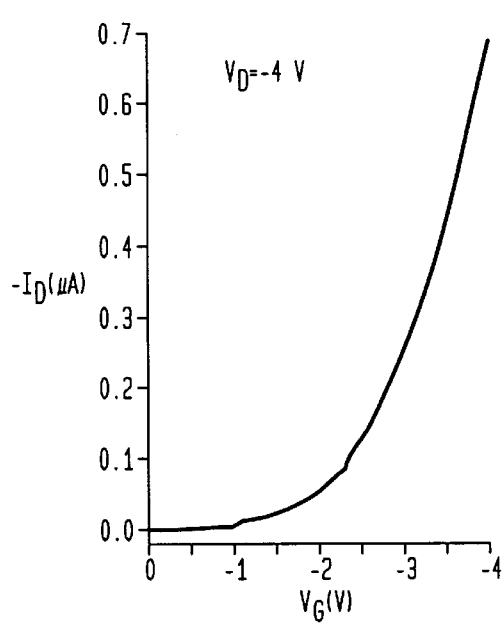
FIG. 9a shows the drain current as a function of gate voltage at fixed source-drain voltage, from a TFT comprising a pentacene semiconductor layer and a BST gate insulator layer, disposed by spin coating a solution different than the one used in the sample of FIG. 7 and 8.
Figure 9B:
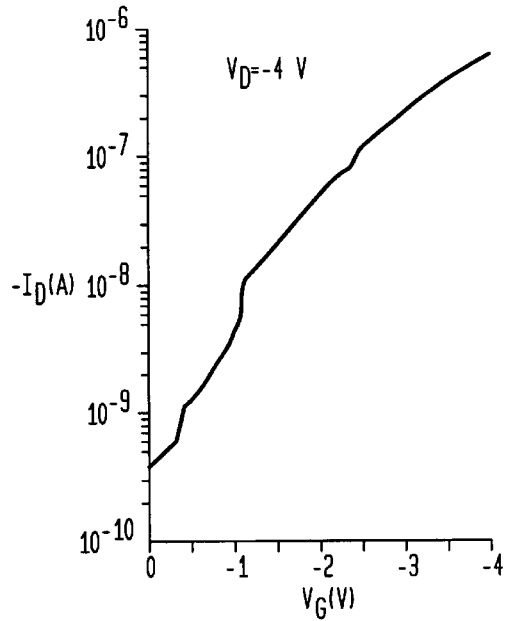
FIG. 9b is the plot of the data from FIG. 9a in a semilogarithmic scale used to calculate the current modulation and sub-threshold slope.
Figure 9C:
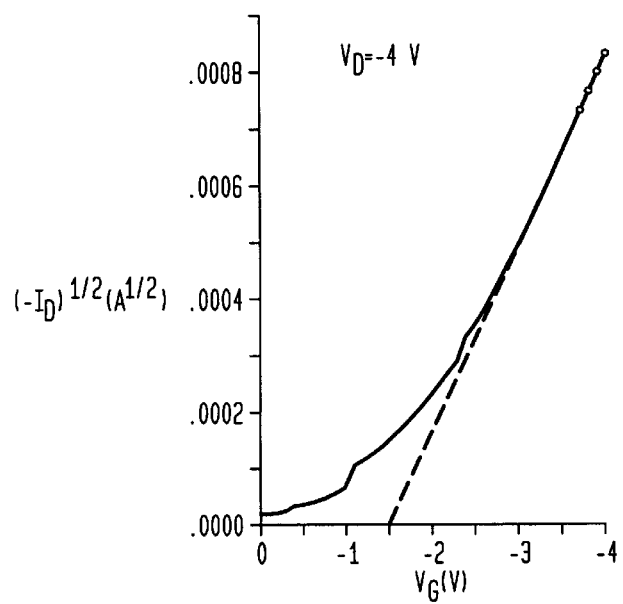
FIG. 9c is a plot of the square root of the drain current from FIG. 9b as a function of the gate voltage in the saturation regime to calculate the field effect mobility.

FIG. 9a and 9b refer to a pentacene-based TFT, represented by the drawing in FIG. 6, in which capacitance per unit area of the BST gate-insulator layer was similar to the BST film in the previous device. The BST layer was deposited as described before from the second type of sol gel solution of Ba, Sr, and Ti organometallic precursors. Both figures show the dependence of $I_D$ on $V_G$ in saturation. FIG. 9c shows a plot of the square root of $I_D$ vs $V_G$. The field effect mobility, $\mu$, is calculated from the slope of the $\sqrt{|I_D|}$ vs. $V_G$ plot to be 0.62 cm$^2$ V$^{-1}$ sec$^{-1}$. The subthreshold slope, S, is approximately 0.4 volts per decade of current modulation. The channel length was 109 $\mu$m and the channel width, W, was 250 $\mu$m.

Thus, it is clear that high mobilities and low sub-threshold slopes can be achieved in pentacene based TFT devices when one uses high dielectric constant films as gate insulators. This substantiates our hypothesis that the gate voltage dependence in these devices is a result of higher concentration of the charge carriers achieved with these insulators, since the applied gate fields were kept very low.

Notwithstanding the specific mechanism of how the characteristics are achieved, we claim that we have demonstrated a structure and a process to fabricate the same to achieve high field effect mobilities, high current modulation and low sub-threshold slope in pentacene based organic TFT's. While the present invention has been described with respect to preferred embodiments, numerous modifications, changes, and improvements will occur to those skilled in the art without departing from the spirit and scope of the invention.

What is claimed is:

1. A thin film transistor device structure comprising;
   a substrate on which a plurality of electrically conducting gate electrodes are disposed;
   a layer of high dielectric constant gate insulator disposed on said electrodes;
   a layer of an organic semiconductor disposed on said insulator and substantially overlapping the said electrodes;
   a plurality of sets of electrically conductive source and drain electrodes disposed on said organic semiconductor in alignment with each of the said gate electrodes;
   said high dielectric constant insulator is selected from the group consisting of barium strontium titanate, barium zirconate titanate, lead zirconate titanate, lead lanthanum titanate, barium titanate, strontium titanate, barium magnesium fluoride, tantalum pentoxide, titanium dioxide and yttrium trioxide.

2. A structure according to claim 1 further including an insulating passivation layer disposed on said structure that protects it from further processing exposures and from the external ambient.

3. A structure according to claim 1 wherein the substrate is selected from the group consisting of glass, plastic, quartz, undoped silicon and heavily doped silicon.

4. A structure according to claim 3 wherein the said plastic substrate is selected from the group comprising polycarbonate, Mylar, and polyimide.

5. A structure according to claim 1 wherein the said gate electrode material is selected from the group consisting of chromium, titanium, copper, aluminum, molybdenum, tungsten, nickel, gold, platinum, conducting polyaniline, conducting polypyrrole or combinations thereof.

6. A structure according to claim 1 wherein said gate electrodes are 30 nm to 500 nm thick and are produced by a process selected from the group consisting of evaporation, sputtering, chemical vapor deposition, electrodeposition, spin coating, and electroless plating.

7. A structure according to claim 1 wherein the said insulator has a thickness in the range of 80 nm to 1000 nm.

8. A structure according to claim 1 wherein the said insulator is produced by a process selected from the group consisting of sputtering, chemical vapor deposition, sol gel coating, evaporation and laser ablative deposition.

9. A thin film transistor device structure comprising:
   a substrate on which a plurality of electrically conducting gate electrodes are disposed;
   a layer of high dielectric constant gate insulator disposed on said electrodes;
   a layer of an organic semiconductor disposed on said insulator and substantially overlapping the said electrodes;
   a plurality of sets of electrically conductive source and drain electrodes disposed on said organic semiconductor in alignment with each of the said gate electrodes; and
   said high dielectric constant insulator is selected from the group consisting of barium strontium titanate, barium zirconate titanate, lead zirconate titanate, lead lanthanum titanate, barium titanate, strontium titanate, barium magnesium fluoride, tantalum pentoxide, titanium dioxide and yttrium trioxide.

10. A structure according to claim 1 wherein said organic semiconductor is any polymeric or oligomeric semiconductor that exhibits an increase in field effect mobility with increasing gate voltage.

11. A structure according to claim 10 wherein said organic semiconductor is an acene molecular material.

12. A structure according to claim 11 wherein said acene is selected from the group consisting of one or more of naphtalene, anthracene, tetracene, pentacene, hexacene and derivatives thereof.

13. A structure according to claim 10 wherein the said organic semiconductor layer has a thickness in the range from one monolayer to 400 nm.

14. A structure according to claim 10 wherein the said semiconductor layer is deposited by a process selected from the group consisting of evaporation, chemical vapor deposition, spin coating and baking, electropolymerization, molecular beam deposition and self assembly from solution or a combination thereof.

15. A structure according to claim 10 wherein the said semiconductor layer is optionally segmented by a process selected from the group consisting of deposition through a mask, screen printing, stamping, and patterning of the blanket film, in order to minimize the leakage and stray currents in the TFT device.

16. A structure according to claim 1 wherein said source and drain electrodes are made of material selected from the group consisting of chromium, titanium, copper, aluminum, molybdenum, tungsten, nickel, gold, palladium, platinum, conducting polymers and combinations thereof.

17. A structure according to claim 16 wherein an optional ohmic contact layer made of a material selected from the group consisting of gold, platinum, palladium, conducting polymers and oligomers, semiconducting polymers and oligomers, and combination thereof, is disposed between said source/drain electrodes and said semiconductor layer.

18. A structure according to claim 16 wherein the thickness of the said source and drain electrodes is in the range 30 nm to 500 nm.

19. A structure according to claim 16 wherein said source and drain electrodes are patterned by a method selected from the group consisting of deposition through shadow mask and lithographic patterning techniques.

20. A structure according to claim 2 wherein said passivation layer is a polymer selected from the group consisting of polyimide, parylene and undoped polyaniline.

* * * * *